US012142556B2

(12) United States Patent
Chen et al.

(10) Patent No.: US 12,142,556 B2
(45) Date of Patent: Nov. 12, 2024

(54) X-RAY SHIELDING STRUCTURE FOR A CHIP

(71) Applicant: INTERNATIONAL BUSINESS MACHINES CORPORATION, Armonk, NY (US)

(72) Inventors: Hsueh-Chung Chen, Cohoes, NY (US); Yann Mignot, Slingerlands, NY (US); Mary Claire Silvestre, Clifton Park, NY (US); Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 425 days.

(21) Appl. No.: 17/448,445

(22) Filed: Sep. 22, 2021

(65) Prior Publication Data

US 2023/0088602 A1    Mar. 23, 2023

(51) Int. Cl.
*H01L 23/498* (2006.01)
*H01L 21/48* (2006.01)
(Continued)

(52) U.S. Cl.
CPC .... *H01L 23/49866* (2013.01); *H01L 21/4857* (2013.01); *H01L 21/486* (2013.01);
(Continued)

(58) Field of Classification Search
CPC . H01L 23/57–573; H01L 24/20; H01L 24/19; H01L 23/49866; H01L 21/4857; H01L 23/49822; H01L 24/18–25; H01L 24/82; H01L 23/53209–53252; H01L 23/5383; H01L 23/53223; H01L 23/53238
See application file for complete search history.

(56) References Cited

U.S. PATENT DOCUMENTS 5,594,279 A    1/1997   Itou
5,889,316 A    3/1999   Strobel
(Continued)

FOREIGN PATENT DOCUMENTS

CN    105609151 B    8/2018

OTHER PUBLICATIONS

Lau, "Recent Advances and Trends in Fan-Out Wafer/Panel-Level Packaging", Journal of Electronic Packaging, ASME, Dec. 2019, vol. 141, pp. 1-27.
Levine, et al., "Mass Absorption Coefficient of Tungsten and Tantalum, 1450 eV to 2350 eV: Experiment, Theory, and Application," Journal of Research of the National Institute of Standards and Technology, Jan.-Feb. 2003, pp. 1-10, <https://www.ncbi.nlm.nih.gov/pmc/articles/PMC4844524/>.
(Continued)

*Primary Examiner* — Evan G Clinton
(74) *Attorney, Agent, or Firm* — Caleb D. Wilkes (57) ABSTRACT

A redistribution layer for an integrated circuit package is provided. The redistribution layer includes a first conductive layer and a second layer disposed directly on the first conductive layer. The first conductive layer has a resistivity of less than $3.6*10^{-8}$ $\Omega \cdot m$ and has a thickness of greater than or equal to 1 µm. The second layer includes tungsten. An integrated circuit package is also provided that includes the redistribution layer electrically connecting a first integrated circuit of the first integrated circuit package to a first input/output of a frame of the integrated circuit package. The frame is connected to the first integrated circuit. A method for manufacturing a redistribution layer is also provided.

20 Claims, 8 Drawing Sheets

(51) Int. Cl.
H01L 23/00 (2006.01)
H01L 23/552 (2006.01)
(52) U.S. Cl.
CPC ...... H01L 23/49822 (2013.01); H01L 23/552 (2013.01); H01L 23/57 (2013.01)

(56) References Cited

U.S. PATENT DOCUMENTS

| | | | |
|---|---|---|---|
| 6,720,493 | B1 | 4/2004 | Strobel |
| 7,563,718 | B2 | 7/2009 | Kim |
| 8,237,358 | B2 | 8/2012 | Pang |
| 8,617,929 | B2 | 12/2013 | Barth |
| 11,094,637 | B2 | 8/2021 | Rubin |
| 2010/0295191 | A1* | 11/2010 | Kikuchi ............ H01L 23/49838 257/784 |
| 2020/0294968 | A1 | 9/2020 | Sikka |
| 2020/0312794 | A1* | 10/2020 | West ..................... H01L 23/642 |
| 2020/0381293 | A1* | 12/2020 | Yang ................... H01F 17/0013 |
| 2021/0028061 | A1 | 1/2021 | Farooq |
| 2021/0159117 | A1 | 5/2021 | Wang |
| 2021/0175174 | A1 | 6/2021 | Farooq |

OTHER PUBLICATIONS

NIST, "NIST: X-Ray Mass Attenuation Coefficients—Lead", NIST, [accessed Sep. 11, 2021], Retrieved from the Internet: <https://physics.nist.gov/PhysRefData/XrayMassCoef/ElemTab/z82.html>.
NIST, "NIST: X-Ray Mass Attenuation Coefficients—Tungsten", NIST, [accessed Sep. 11, 2021], Retrieved from the Internet: <https://physics.nist.gov/PhysRefData/XrayMassCoef/ElemTab/z74.html>.
NSM, "Aluminum n/k diagram," 1 page, [accessed Sep. 9, 2021], Retrieved from the Internet: <http://www.ioffe.ru/SVA/NSM/nk/AluminumCompounds/Gif/al.gif>.
NSM, "n, k Database," ioffe.ru, 2 pgs., [accessed Jul. 9, 2021], Retrieved from the Internet: <http://www.ioffe.ru/SVA/NSM/nk/>.
NSM, "Tungsten n/k diagram," 1 page, [accessed Sep. 9, 2021], Retrieved from the Internet: <http://www.ioffe.ru/SVA/NSM/nk/Metals/Gif/w.gif>.
Psi Paul Scherrer Insitut, "3D Imaging for Planar Samples with Zooming," Oct. 7, 2019, 7 pgs., <https://www.psi.ch/en/coherent-x-ray-scattering/scientific-highlights/3d-imaging-for-planar-samples-with-zooming>.

* cited by examiner

X-RAY SHIELDING STRUCTURE FOR A CHIP

BACKGROUND

The present invention relates generally to integrated circuits that may be used in a variety of computer systems and electronic devices.

SUMMARY

According to one exemplary embodiment, a redistribution layer for an integrated circuit package is provided. The redistribution layer includes a first conductive layer and a second layer disposed directly on the first conductive layer. The first conductive layer has a resistivity of less than $3.6*10^{-8}$ $\Omega \cdot m$ and has a thickness of greater than or equal to 1 µm. The second layer includes tungsten. An integrated circuit package is also provided that includes the redistribution layer electrically connecting a first integrated circuit of the integrated circuit package to a first input/output of a frame of the integrated circuit package. The frame is connected to the first integrated circuit. A method for manufacturing a redistribution layer is also provided that includes applying a first conductive layer and applying a second layer directly onto the first layer. The first conductive layer has a resistivity of less than $3.6*10^{-8}$ $\Omega \cdot m$ and has a thickness of greater than or equal to 1 µm. The second layer includes tungsten.

BRIEF DESCRIPTION OF THE DRAWINGS

These and other objects, features, and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

The following described exemplary embodiments provide a redistribution layer for an integrated circuit, an integrated circuit package, and a method for manufacturing the redistribution layer. Integrated circuits also known as chips or dies in many instances have valuable and/or proprietary designs. Circuit designers and/or manufacturers may have incentive to keep integrated circuit designs confidential and to provide obstacles that can inhibit reverse engineering of the circuit design. Ptychographic x-ray laminography has been used to conduct reverse engineering on circuits quickly, easily, and without time-consuming steps.

The present embodiments have structure that helps block integrated circuit design discovery by blocking x-rays, e.g., soft x-rays and/or ptychographic x-rays which otherwise might be used to successfully perform reverse engineering and easily identify a confidential chip design. The blocking structure may be efficiently and expediently included in an integrated circuit to achieve enhanced design security. Soft x-rays which may have wavelengths within a range of 20 to 200 angstroms may be blocked by the blocking structure of the present embodiments. The shielding structure may be implemented for a variety of chip designs to help provide circuit design security for the respective circuit design. The shielding structure may prevent the x-ray detection of a circuit layout.

Tungsten has surprisingly been found to be a suitable material for blocking soft x-rays that would come to an integrated circuit for circuit design discovery. Tungsten has a high density of 19.25 g/cm³ and has an atomic number of 74 and has a better mass attenuation coefficient than lead has. A layer of tungsten that is 1 µm (1 µmicron) thick or more may shield against and block typical soft x-ray beams. A tungsten-capped aluminum redistribution layer is effective in shielding against and blocking typical soft x-ray beams that may come from the exterior of an integrated circuit. This unique redistribution layer may be integrated into a CMOS circuit.

Integrated circuits according to the present embodiments may be implemented for a variety of uses such as in baseband, power management, RF switch/transceivers, RF radar, audio codec, microcontrollers, connectivity circuits, application processors, memories such as dynamic random access memories, both high-end and low-end central processors, field programmable gate arrays, graphic processors, etc.

Figure 1:
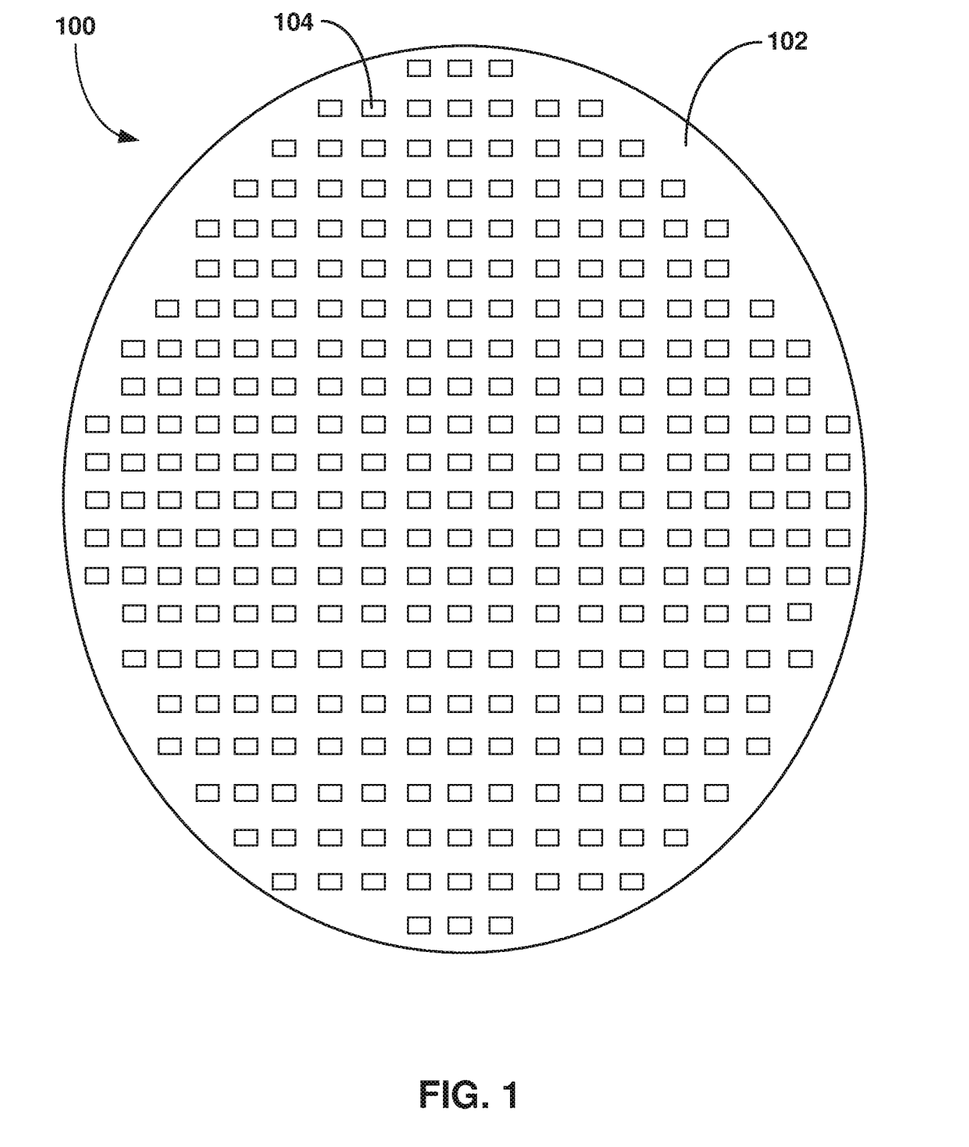
FIG. 1 is a top view of a reconstituted wafer containing a number of integrated circuits.

In FIG. 1, a reconstituted wafer 100 is shown in a top view. The reconstituted wafer 100 is shown as having a circular shape and includes a wafer base 102 and a number of chips 104 integrated into the wafer base 102. One of the chips 104 is labelled in the drawing. The wafer base 102 may be silicon or organic. The wafer base 102 may in subsequent steps of a method of forming a chip package be diced into pieces. The reconstituted wafer 100 may be a temporary carrier. The chips 104 are spaced from each other as they are integrated into the wafer base 102. The chips 104 may be referred to as integrated circuits, dies, and/or semiconductor chips.

In alternative embodiments, a panel may be used instead of a wafer base 102. The panel may have a rectangular shape instead of a round/circular shape. The panel may be formed of metal, glass, silicon, or an organic material. The panel may hold a number of circuit chips such as the chips 104.

Figure 2A:
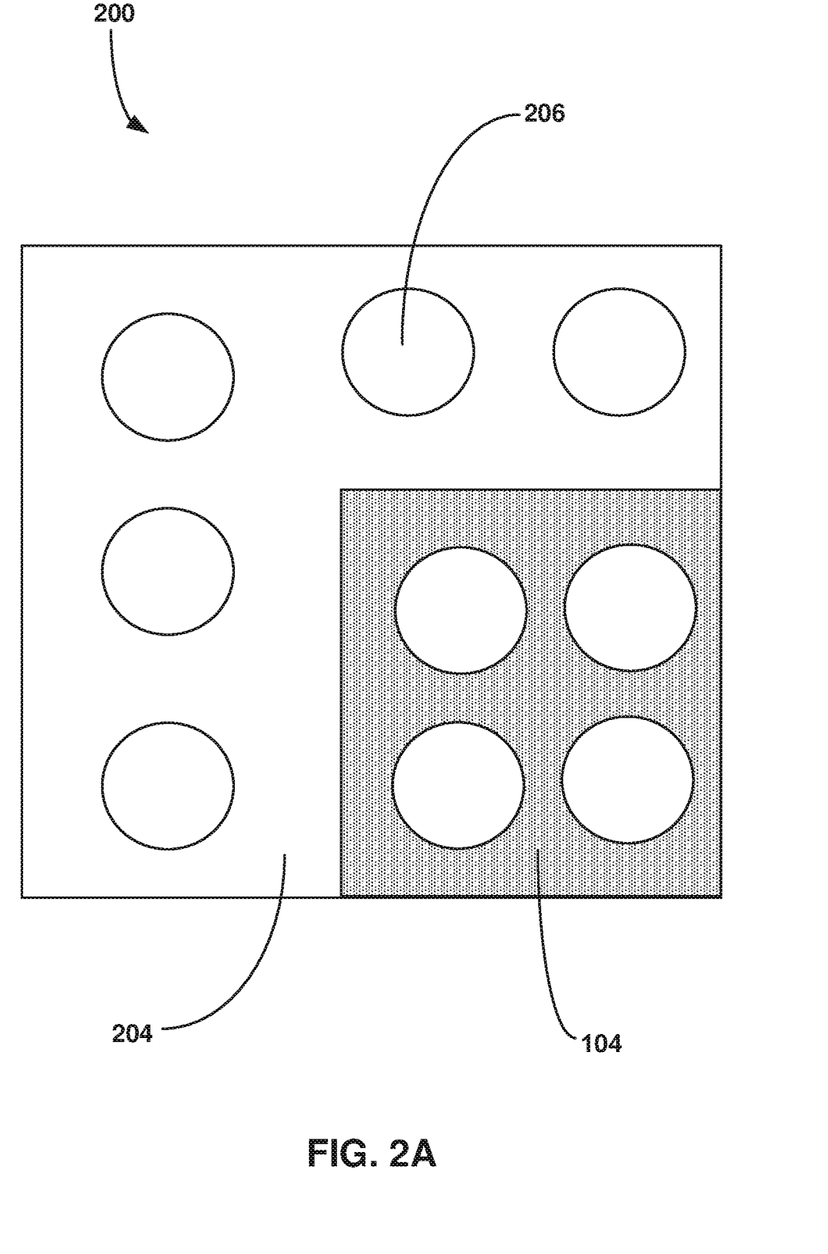
FIG. 2A is a top view of a portion of an integrated circuit package.

FIG. 2A shows a top view of a portion of an integrated circuit package 200 according to one exemplary embodiment. The integrated circuit package 200 may include one of the chips 104 as shown in FIG. 1, a fan-out region 204, and various inputs/outputs 206. The integrated circuit package 200 may be at an intermediate stage of manufacturing. FIG. 2A shows a corner portion of the chip 104, specifically an upper left portion of the chip 104. The various inputs/outputs 206 may include solder bumps, e.g., solder balls. These inputs/outputs 206 may be disposed as depicted both in the chip portion and in the fan-out region 204. The fan-out region 204 may represent a portion of the packaging that surrounds the integrated circuit. The fan-out region may be referred to as a chip frame. The fan-out region 204 may be larger than the chip 104 and may laterally surround the chip 104 on four sides of the chip 104. The inputs/outputs 206 may in a subsequent processing step be physically connected to an exterior electrical object such as a printed circuit board so as to electrically connect the integrated circuit to an exterior electrical object.

An integrated circuit package may include multiple chips all embedded within the same chip frame that is made of a packaging material that may include an electrically insulating material.

Redistribution layers which are not visible in FIG. 2A (due to being underneath an upper surface of the integrated circuit) may connect the chips 104 to the inputs/outputs 206 that are in the fan-out region 204. Including inputs/outputs 206 such as solder bumps in the fan-out region 204 provides production and operation advantages such as a reduction in thermal load.

A redistribution layer (RDL) may refer to an extra metal layer on a chip that makes input/outputs, such as an input/output pad, of an integrated circuit available in other locations of the chip, for better access to the inputs/outputs where necessary. When an integrated circuit is manufactured, the integrated circuit usually has a set of inputs/outputs that are wirebonded to pins of the package. A redistribution layer may be an extra layer of wiring on the chip that enables bonding out from different locations on the chip, e.g., at a location in a packaging material disposed on the chip packaging peripheral to the location of the chip. Thus, redistribution layers make chip-to-chip bonding simpler. A redistribution layer may also refer to a structure for spreading contact points around a die so that more solder bumps can be applied and so that the thermal stress of mounting can be spread. A redistribution layer makes an electrical connection from the chip itself to an input/output such as a solder bump at locations peripheral to the circuit chip. The redistribution layer may connect to an interconnect, e.g., a vertical interconnect, to electrically connect to the circuit chip. A redistribution layer may in some embodiments be a continuous or mostly-continuous layer that extends over the entire chip or most of the chip. In many embodiments, however, the redistribution layer is etched to form a wiring pattern and forms a mesh layer over the interior circuit.

Figure 2B:
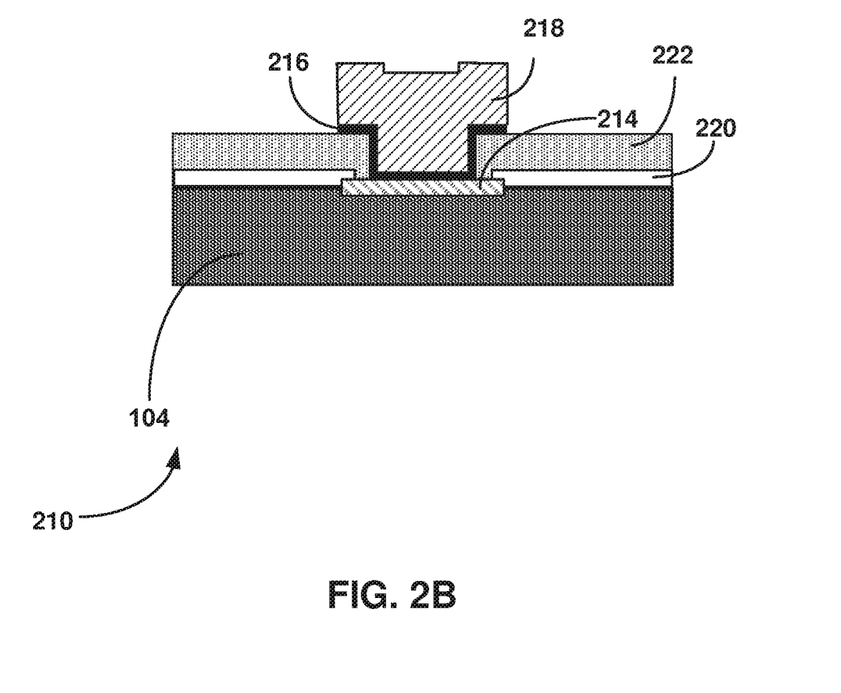
FIG. 2B is a cross-sectional view of a chip output section of an integrated circuit that may be part of the integrated circuit package shown in FIG. 2A and may be part of one of the integrated circuits shown in FIG. 1.

FIG. 2B is a cross-sectional view of a chip output section 210 for an integrated circuit, e.g., for the chip 104 that was shown in FIG. 1. The additional elements of the chip output section 210 may be added to the chip 104 in processing steps. The chip output section 210 may be part of the integrated circuit package 200 that is shown in FIG. 2A. The chip output section 210 may include a metal layer stack for electrically connecting the chip 104 to a package input/output such as a solder bump. This connection may be to a package input/output within the chip area, so that this metal layer stack does not need a redistribution layer to connect to this package input/output. The chip 104 may be formed of silicon or some other semiconducting material. The metal layer stack may include a first contact pad 214, a sputtered layer 216, and a second contact pad 218. The metal layer stack may be referred to as an interconnect, e.g., a vertical interconnect. The chip 104 which is part of an integrated circuit package 200 according to at least some embodiments may include multiple chip output sections 210 connected to the chip 104.

The first contact pad 214 directly contacts the chip 104 in an electrically conductive manner. The first contact pad 214 may be formed of aluminum or another electrically conductive material. The sputtered layer 216 may be formed directly on the first contact pad 214 as a seed/adhesive layer. The sputtered layer 216 may be formed via a physical vapor deposition. The sputtered layer 216 may be formed of a Ti/Cu composition. The second contact pad 218 may be formed on the sputtered layer 216. A package input/output such as a solder bump may be connected to the second contact pad 218. The second contact pad 218 may be formed of Copper (Cu) or another electrically conductive material and may be electroplated onto the sputtered layer 216.

A first insulation layer 220 is disposed directly on top of the chip 104. The metal layer stack and particularly the first contact pad 214 extends through an opening in the first insulation layer 220 in order to directly contact the chip 104. The first insulation layer 220 may be dielectric and may be formed of silicon dioxide ($SiO_2$) or some other dielectric material. A second insulation layer 222 is disposed directly on the first insulation layer 220. The second insulation layer 222 may be formed of a polymer, e.g., polyimide, or another dielectric material. The sputtered layer 216 and a via of the second contact pad 218 extend through an opening in the second dielectric layer 222 in order to electrically contact the first contact pad 214.

Figure 3:
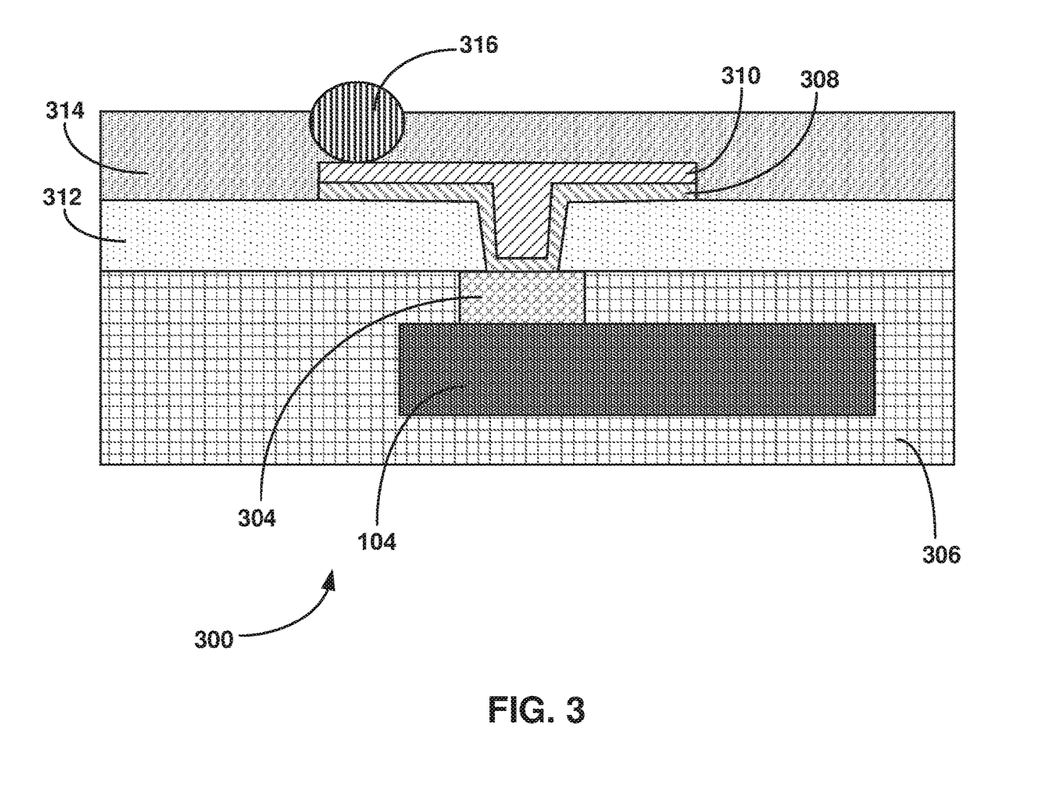
FIG. 3 is a cross-sectional view of an integrated circuit with a shielding redistribution layer in accordance with at least one embodiment.

FIG. 3 shows a cross-sectional view of a semiconductor chip package 300 according to an exemplary embodiment which includes a redistribution layer able to shield x-rays. The semiconductor chip package 300 includes the chip 104 surrounded by an embedding 306. The semiconductor chip package 300 may include one or more of the chip output section 210 shown in FIG. 2A for connecting the chip 104 to an input/output within a peripheral area of the chip 104. The chip 104 is embedded in the embedding 306. The embedding 306 may be formed by an epoxy molding compound. A contact pad 304 is also embedded within the embedding 306 but has an exposed outer surface. The contact pad 304 contacts the chip 104 in an electrically conductive manner. The contact pad 304 also directly contacts a redistribution layer so as to connect the chip 104 to the redistribution layer in an electrically conductive manner.

The redistribution layer includes a first conductive layer 308 which may have a resistivity of less than $3.6*10^{-8}$ $\Omega\cdot m$. Thus, the first conductive layer 308 may include or consist of aluminum, gold, copper, silver, and/or a combination of these conductive elements which have low electrical resistivity. Having a resistivity of less than $3.6*10^{-8}$ $\Omega\cdot m$ is helpful so that the redistribution layer provides sufficient ability to transfer electrons from the chip and through the outputs to another connected external structure such as a printed circuit board and other semiconductors, connectors, resistors, diodes, capacitors, and radio devices that may be connected to the printed circuit board. In at least some embodiments, the first conductive layer 308 may include or consist of aluminum. The first conductive layer 308 may have a thickness of from 1 µm to 3 µm. The first conductive layer 308 may have a thickness that has a range of greater than or equal to 1 µm and less than or equal to 3 µm. The first conductive layer 308 may have a thickness having a range of approximately 1 µm to approximately 3 µm. The first conductive layer 308 may have a thickness that is greater than or equal to 1 In at least one embodiment, the first conductive layer 308 has a thickness of 2.75 µm. Having such thicknesses, e.g., a thickness of 1 µm or greater, allows the first conductive layer 308 to achieve sufficient conducting of electrons from the chip to external devices. Thinner layers such as an adhesion layer, a diffusion barrier layer, and/or a solderable layer may typically not achieve by themselves the desirable conduction.

A cap layer 310 which may include or consist of tungsten directly contacts the first conductive layer 308. The cap layer 310 may have a thickness of from 1 µm to 2 µm. The cap layer 310 may have a thickness having a range of greater than or equal to 1 µm and less than or equal to 2 µm. The cap layer 310 may have a thickness having a range of approximately 1 µm to approximately 2 µm. The cap layer 310 may have a thickness greater than or equal to 1 µm. In at least some embodiments, the cap layer 310 has a thickness equal to 1 µm. Having such thicknesses, e.g., a thickness of 1 µm or greater, allows the cap layer 310 to sufficiently block x-rays that are externally generated from a package.

A first dielectric layer 312 surrounds a via portion of the first conductive layer 308 and of the cap layer 310 and helps provide insulation. A second dielectric layer 314 is applied on the first dielectric layer 312 and is exposed to an exterior of the semiconductor chip package 300. The second dielectric layer 314 may be considered a packaging layer and may be the outermost layer of the semiconductor chip package 300. The first dielectric layer 312 and/or the second dielectric layer 314 may in some instances be considered to be part of the first redistribution layer of which the first conductive layer 308 and the cap layer 310 are part. The first and the second dielectric layers 312, 314 may be formed of materials such as silicon dioxide, SiN, and/or of a polymer such as polybenzobisoxazole, polyimide, and/or benzo cyclobutene.

An input/output 316 which may be a solder bump, e.g., a solder ball, is also exposed to the exterior and extends through an opening in the second dielectric layer 314 to contact and electrically connect to the cap layer 310. FIG. 3 shows that the input/output 316 is disposed on a lateral periphery of the chip 104. This lateral positioning of the input/output 316 indicates that this input/output 316 is in a fan-out region of the semiconductor chip package 300, e.g., in the fan-out region 204. Portions of the embedding 306, the first dielectric layer 312, and the second dielectric layer 314 may constitute and/or be part of the fan-out region 204. The solder bump embodiment of the input/output 316 may be formed of tin, silver, copper, and/or lead or other electrically conductive material.

The first redistribution layer which is formed by the combination of the first conductive layer 308 and the cap layer 310 may have a total thickness of from 2 µm to 5 µm. The first redistribution layer may have a total thickness that has a range of greater than or equal to 2 µm and less than or equal to 5 µm. The first redistribution layer may have a total thickness having a range of approximately 2 µm to approximately 5 µm. The first redistribution layer may have a total thickness that is greater than or equal to 2 µm. In at least one embodiment, the first redistribution layer has a total thickness of 3.75 µm.

Figure 4:
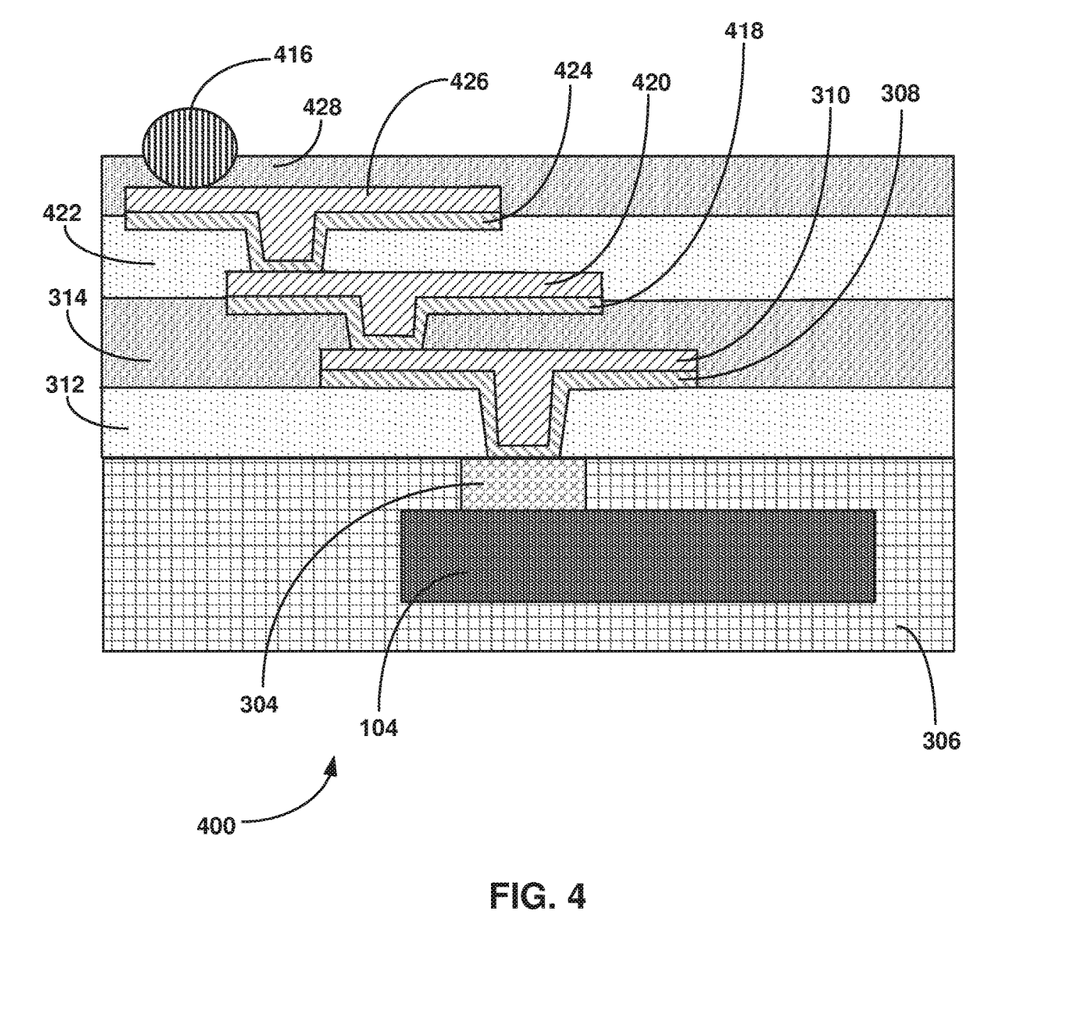
FIG. 4 is a cross-sectional view of an integrated circuit with multiple levels of shielding redistribution layers in accordance with at least one other embodiment.

FIG. 4 shows a cross-sectional view of a shielding semiconductor chip package 400 according to an exemplary embodiment. The semiconductor chip package 400 includes multiple levels of redistribution layers able to shield against x-rays. Elements that are the same in the shielding semiconductor chip package 400 as in the semiconductor chip package 300 shown in FIG. 3 are labeled with the same reference numerals. Thus, the shielding semiconductor chip package 400 like the semiconductor chip package 300 includes the chip 104, a contact pad 304, an embedding 306, a first conductive layer 308, a cap layer 310, a first dielectric layer 312, and a second dielectric layer 314.

In addition, the shielding semiconductor chip package 400 includes a second level of one or more redistribution layers. The second level includes a second conductive layer 418 and a second cap layer 420 that is disposed directly on and against the second conductive layer 418. The second conductive layer 418 and the second cap layer 420 include via extensions which extend downwardly toward the cap layer 310 of the first redistribution layer. The via extension of the second conductive layer 418 may be disposed directly on and against the cap layer 310.

The second conductive layer 418 may have a resistivity of less than $3.6*10^{-8}$ Ω·m. Thus, the second conductive layer 418 may include or consist of aluminum, gold, copper, silver, and/or a combination of these conductive elements which have low electrical resistivity. In at least some embodiments, the second conductive layer 418 may include or consist of aluminum. The second conductive layer 418 may have a thickness of from 1 µm to 3 µm. The second conductive layer 418 may have a thickness that has a range of greater than or equal to 1 µm and less than or equal to 3 µm. The second conductive layer 418 may have a thickness having a range of approximately 1 µm to approximately 3 µm. The second conductive layer 418 may have a thickness greater than or equal to 1 µm. In at least one embodiment, the second conductive layer 418 has a thickness of 2.75 µm. Having such thicknesses, e.g., a thickness of 1 µm or greater, allows the second conductive layer 418 to achieve sufficient conducting of electrons from the chip to external devices. Thinner layers such as an adhesion layer, a diffusion barrier layer, and/or a solderable layer may typically not achieve by themselves the desirable conduction.

The second cap layer 420 may include or consist of tungsten. The second cap layer 420 may have a thickness of from 1 µm to 2 µm. The second cap layer 420 may have a thickness having a range of greater than or equal to 1 µm and less than or equal to 2 µm. The second cap layer 420 may have a thickness having a range of approximately 1 µm to approximately 2 µm. The second cap layer 420 may have a thickness greater than or equal to 1 µm. In at least some embodiments, the second cap layer 420 may have a thickness equal to 1 µm. Having such thicknesses, e.g., a thickness of 1 µm or greater, allows the second cap layer 420 to sufficiently block x-rays that are externally generated from a package.

In this embodiment shown in FIG. 4, the first conductive layer 308 and the cap layer 310 may together constitute a first redistribution level.

The second level of redistribution layers which is formed by the combination of the second conductive layer 418 and the second cap layer 420 may have a total thickness of from 2 µm to 5 µm. The second level of redistribution layers may have a total thickness that has a range of greater than or equal to 2 µm and less than or equal to 5 µm. The second level of redistribution layers may have a thickness having a range of approximately 2 µm to approximately 5 µm. The second level of redistribution layers may have a thickness greater than or equal to 2 µm. In at least one embodiment, the second level of redistribution layers has a thickness of 3.75 µm. In some embodiments, the second dielectric layer 314 and the third dielectric layer 422 or portions of same may be considered as being part of the second level of redistribution layers.

The second level of the redistribution layers may be considered to have a second height level. The first level of the redistribution layers may be considered to have a first height level. The first height level may be different than the second level. Particularly, in the orientation shown in FIG. 4 the first height level may be at a lower or smaller height than the height of the second height level.

In addition, the shielding semiconductor chip package 400 shown in FIG. 4 includes a third level of redistribution layers. The third level includes a third conductive layer 424 and a third cap layer 426 that is disposed directly on and against the third conductive layer 424. The third conductive layer 424 and the third cap layer 426 may include via extensions which extend downwardly toward the second redistribution level and particularly to the second cap layer 420. The via extension of the third conductive layer 424 may be disposed directly on and against the second cap layer 420.

The third conductive layer 424 may have a resistivity of less than $3.6*10^{-8}$ Ω·m. Thus, the third conductive layer 424 may include or consist of aluminum, gold, copper, silver, and/or a combination of these conductive elements which have low electrical resistivity. In at least some embodiments, the third conductive layer 424 may include or consist of aluminum. The third conductive layer 424 may have a thickness of from 1 µm to 3 µm. The third conductive layer 424 may have a thickness that has a range of greater than or equal to 1 µm and less than or equal to 3 m. The third conductive layer 424 may have a thickness having a range of approximately 1 µm to approximately 3 µm. The third conductive layer 424 may have a thickness greater than or equal to 1 µm. In at least some embodiments, the third conductive layer 424 has a thickness of 2.75 µm. Having such thicknesses, e.g., a thickness of 1 µm or greater, allows the third conductive layer 424 to achieve sufficient conducting of electrons from the chip to external devices. Thinner layers such as an adhesion layer, a diffusion barrier layer, and/or a solderable layer may typically not achieve by themselves the desirable conduction.

The third cap layer 426 may include or consist of tungsten. The third cap layer 426 may have a thickness of from 1 µm to 2 µm. The third cap layer 426 may have a thickness having a range of greater than or equal to 1 µm and less than or equal to 2 µm. The third cap layer 426 may have a thickness having a range of approximately 1 µm to approximately 2 µm. The third cap layer 426 may have a thickness greater than or equal to 1 µm. Having such thicknesses, e.g., a thickness of 1 µm or greater, allows the third cap layer 426 to sufficiently block x-rays that are externally generated from a package.

A third dielectric layer 422 may provide insulation for the third and/or the second redistribution levels. Some portions of the third dielectric layer 422 may provide insulation between a portion of the third conductive layer 424 and a portion of the second cap layer 420, particularly at the portions away from the via connection between the third conductive layer 424 and the second cap layer 420.

In some embodiments, the third dielectric layer 422 and the fourth dielectric layer 428 or portions of same may be considered as being part of the third level of redistribution layers. The third and the fourth dielectric layers 422, 428 may be formed of materials such as silicon dioxide, SiN, and/or of a polymer such as polybenzobisoxazole, polyimide, and/or benzo cyclobutene.

The third level of redistribution layers which is formed by the combination of the third conductive layer 424 and the third cap layer 426 may have a thickness of from 2 µm to 5 µm. The third level of redistribution layers may have a thickness that has a range of greater than or equal to 2 µm and less than or equal to 5 µm. The third level of redistribution layers may have a thickness having a range of approximately 2 µm to approximately 5 µm. The third level of redistribution layers may have a thickness greater than or equal to 2 µm. In at least one embodiment, the third level of redistribution layers has a thickness of 3.75 µm.

In some embodiments the third level of redistribution layers may have a thickness which is double the thickness of the first level of redistribution layers. In an alternative embodiment with two levels total of redistribution layers, the second higher level may have a thickness which is double the thickness of the first level of the two redistribution layers. Thus, an outermost level of the redistribution layers may in some embodiments have a total thickness which is greater than or equal to two times the total thickness of the first level of redistribution layers.

The third level of the redistribution layers may be considered to have a third height level. The third height level may be different than the second level and may be different than the first level. Particularly, in the orientation shown in FIG. 4 the third height level may be at a higher or greater height than the height of the second height level and at a higher or greater height than the height of the first height level.

An exterior input/output 416 which may be a solder bump is also exposed to the exterior and connects to the third redistribution level and particularly to the third cap layer 426 through the fourth dielectric layer 428. The fourth dielectric layer 428 may be above and around the third cap layer 426 and may form an exterior surface of the shielding semiconductor chip package 400. The fourth dielectric layer 428 may be considered a packaging layer and may be the outermost layer of the shielding semiconductor chip package 400.

The conductive layer and the cap layer which lies directly on the conductive layer may both run in a same direction, e.g., in a first direction. They may have a respective length which is greater than their respective width, with their respective length running in the same direction. A length of the conductive layer and a length of the cap lay may be equal to each other. A width of the conductive layer and a width of the cap lay may be equal to each other. All or some of these features may be applicable to any or all of the combination of the first conductive layer 308 and the cap layer 310, of the combination of the second conductive layer 418 and the second cap layer 420, and of the combination of the third conductive layer 424 and the third cap layer 426.

Portions of the fourth dielectric layer 428 and the third dielectric layer 422 may along with the embedding 306, the first dielectric layer 312, and the second dielectric layer 314 constitute and/or be part of the fan-out region 204 of the shielding semiconductor chip package 400.

Figure 5:
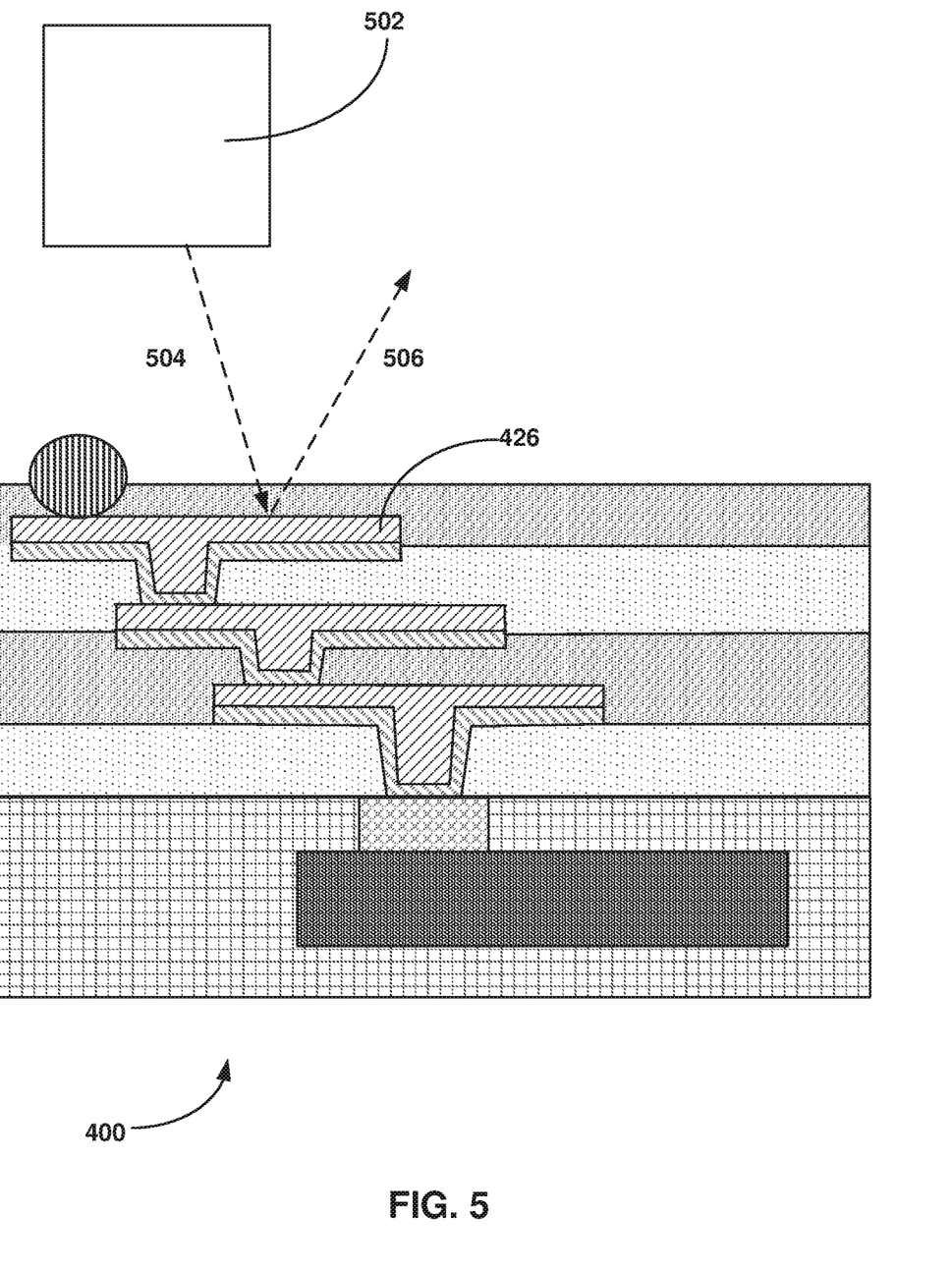
FIG. 5 illustrates the embodiment shown in FIG. 4 as the integrated circuit implements an x-ray blocking process according to at least one embodiment.

FIG. 5 illustrates the use of the shielding semiconductor chip package 400 in an x-ray blocking process. FIG. 5 shows an x-ray scanner 502 transmitting an x-ray wave 504 in an attempt to discover the design of the shielding semiconductor chip package 400. The design is not visible from the exterior of the shielding semiconductor chip package 400, but if the x-ray scanner 502 can successfully transmit and receive the x-ray waves then the x-ray scanner 502 may capture and generate a design image of the shielding semiconductor chip package 400.

FIG. 5 illustrates, however, that the shielding structure, e.g., the third cap layer 426, blocks the x-ray wave 504 without letting the x-ray wave 504 enter into the deeper levels and components of the shielding semiconductor chip package 400. This x-ray wave 504 originated exterior to the shielding semiconductor chip package 400. Thus, the returned x-ray wave 506 will not have the information necessary for the x-ray scanner 502 to capture and generate a design image of the shielding semiconductor chip package 400.

Figure 6:
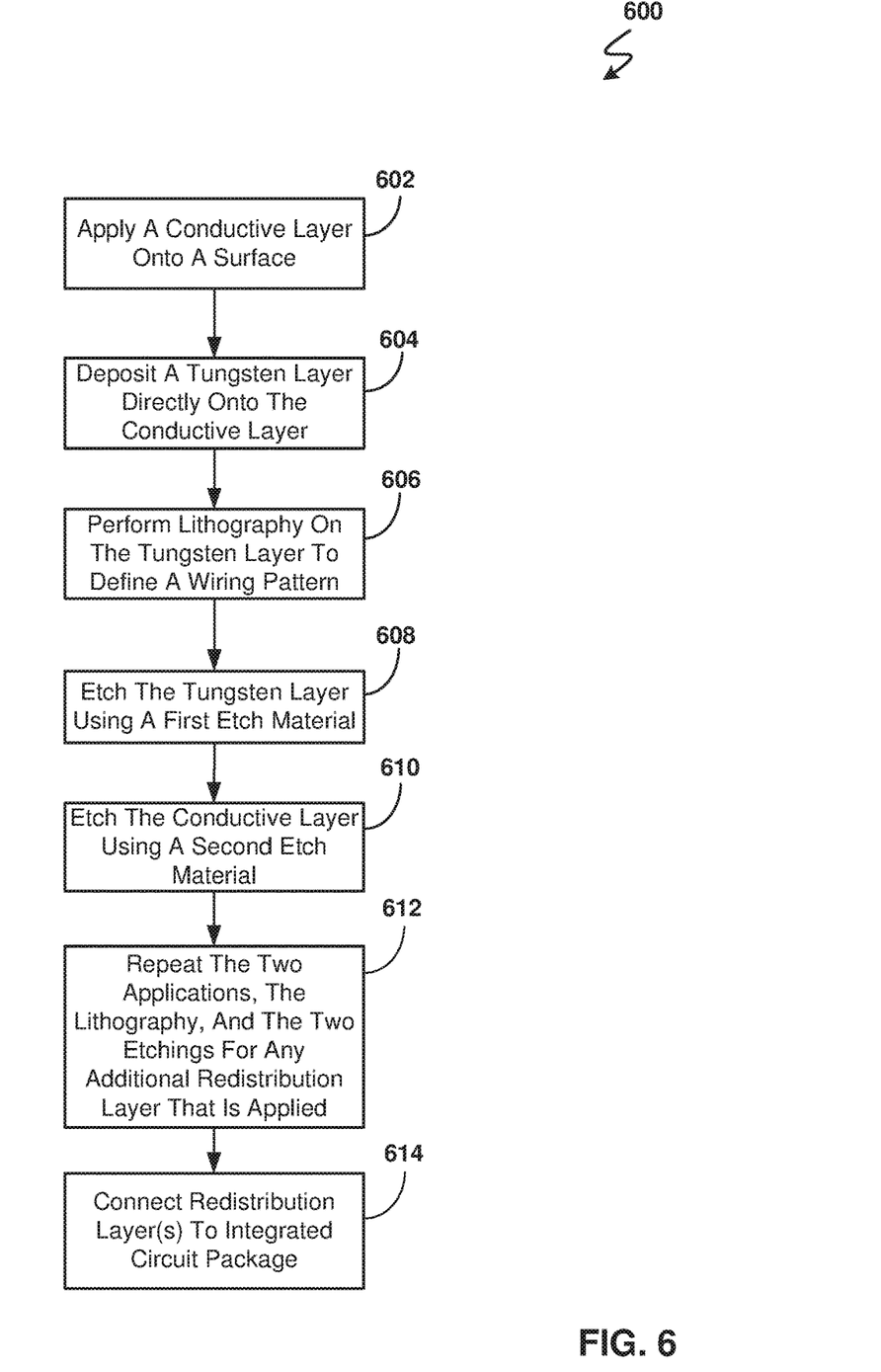
FIG. 6 is an operational flowchart illustrating an x-ray shielding chip manufacturing process according to at least one embodiment.

FIG. 6 is an operational flowchart showing an x-ray shielding chip manufacturing process 600 according to at least one embodiment. The x-ray shielding chip manufacturing process 600 may be implemented to generate a shielding chip such as the semiconductor chip package 300 shown in FIG. 3 or the shielding semiconductor chip package 400 shown in FIG. 4.

In a step 602 of the x-ray shielding chip manufacturing process 600, a conductive layer is applied onto a surface. The surface may be a portion of an integrated circuit or another surface. For embodiments in which the conductive layer is applied to another surface, subsequent connection steps may be carried out to contact the conductive layer to the integrated circuit, e.g., to an interconnect of the integrated circuit. The conductive layer may be deposited, e.g., in a physical vapor deposition, to the surface. The conductive layer may alternatively be electroplated on the surface. The conductive layer may be deposited to directly contact a contact pad that was part of the integrated circuit component. The surface may include a portion of a contact pad of an interconnect and may also include a portion of a passivation layer, e.g., of a dielectric layer. The surface may include a contact pad and a dielectric layer that is over a temporary substrate, e.g., a temporary glass or silicon wafer substrate, whereby the contact pad and dielectric layer with conductive layer and other redistribution layer(s) on top are subsequently transferred to be connected and on the additional portions of the interconnect of the integrated circuit. The material applied in step 602 may consist of or include aluminum. The material applied may have a resistivity of less than $3.6*10^{-8}$ Ω·m. This deposited layer of conductive material may have a thickness of from 1 μm to 3 μm, may have a thickness that has a range of greater than or equal to 1 μm and less than or equal to 3 μm, or may have a thickness having a range of approximately 1 μm to approximately 3 μm. The deposited layer may have a thickness that is greater than or equal to 1 μm.

In a step 604 of the x-ray shielding chip manufacturing process 600, a tungsten layer is applied directly onto the conductive layer. The conductive layer may be that conductive layer that was applied to the surface in step 602. The material applied in step 606 may consist of or include tungsten. This applied layer of tungsten may have a thickness of from 1 μm to 2 μm, may have a thickness that has a range of greater than or equal to 1 μm and less than or equal to 2 μm, or may have a thickness having a range of approximately 1 μm to approximately 2 μm. The application of tungsten in step 604 may occur via a deposition, e.g., a physical vapor deposition, or tungsten.

Applying the tungsten directly to the conductive layer without any TiN layer between the tungsten and conductive layers achieves n/k (refractive index n/absorption index k) improvement for Langmuir-Blodgett (LB) lithography. The refractive index n is high while the absorption index k is low which is desirable so that an x-ray may be reflected or blocked instead of being absorbed.

In a step 606 of the x-ray shielding chip manufacturing process 600, lithography may be performed on the tungsten layer to define a wiring pattern. The wiring pattern may subsequently result in the redistribution layer being a mesh layer over the interior circuit. This step 608 may include masking portions of the tungsten layer to prepare for an etching step.

In a step 608 of the x-ray shielding chip manufacturing process 600, the tungsten layer is etched using a first etch material. The tungsten layer may be that tungsten layer that was applied in step 604. The first etch material may include sulfur hexafluoride ($SF_6$) gas and/or nitrogen trifluoride ($NF_3$) gas. The etching temperature for step 608 may be lower than an etching temperature for step 610.

In a step 610 of the x-ray shielding chip manufacturing process 600, the conductive layer is etched using a second etch material. The second etch material may be different than the first etch material that was used in step 608. The conductive layer that is etched in step 610 may be that conductive layer that was applied in step 602. The second etch material may include chlorine ($Cl_2$) gas and/or boron trichloride ($BCl_3$) gas. Argon and nitrogen ($N_2$) gas may also be used during the etching of step 610 for directionality and dilution. An etching temperature for step 610 may be within a range of 500° C. to 70° C. With the thickness of the tungsten layer being within a range of 1 to 2 μm, the tungsten etching process of step 610 may be stopped easily over the lower aluminum layer with good selectivity. Properly performing the optical endpoint may be achieved when the thickness of the tungsten layer has a range of 1 to 2 μm.

In a step 612 of the x-ray shielding chip manufacturing process 600, the two applications, the lithography, and the two etchings are repeated for any additional distribution level. These repeats may refer to those actions that were performed in steps 602 to 610. For example, for manufacturing the shielding semiconductor chip package 400 shown in FIG. 4 the steps 602 to 610 may be repeated a first time (performed overall a second time) in order to form the second redistribution level that includes the second conductive layer 418 and the second cap layer 420. Also for manufacturing the shielding semiconductor chip package 400 shown in FIG. 4 the steps 602 to 610 may be repeated a second time (performed overall a third time) in order to form the third redistribution level that includes the third conductive layer 424 and the third cap layer 426. Thicknesses and materials that were used for steps 602 to 610 may also be applied for the repeat steps used to create any additional distribution levels. A thickness of the outermost redistribution level may also be greater than a thickness of inner redistribution levels.

In a step 614 of the x-ray shielding chip manufacturing process 600, the redistribution layer(s) are connected to an integrated circuit package. If the surface in step 602 to which the first conductive layer is applied is some contact pad for the semiconductor chip, then step 614 may inherently be performed via the performance of steps 602 to 612. In other embodiments, a transfer may occur so that the redistribution layer(s) subsequently connect to the integrated circuit package. For example, the surface may be a temporary substrate that temporarily holds the redistribution layers.

The x-ray shielding chip manufacturing process 600 and the various semiconductor packages shown may be formed from a chip-last/RDL first process, from a chip-first/die face-up process, or from a chip-first/die face-down process.

It may be appreciated that FIGS. 1-6 provide only illustrations of some embodiments and do not imply any limitations with regard to how different embodiments may be implemented. Many modifications to the depicted embodiment(s), e.g., to a depicted sequence of steps or arrangement of chip components, may be made based on design and implementation requirements.

As will be discussed with reference to FIG. 7, the semiconductor chip package 300 and/or the shielding semiconductor chip package 400 may be implemented into a processor 906 of a processing system 900. The processing system 900 may also include internal components 902a and external components 904a, respectively. The processing system 900 may include, for example, a mobile device, a telephone, a personal digital assistant, a netbook, a laptop computer, a tablet computer, a desktop computer, or any type of computing device capable of running a program, accessing a network, and/or accessing a database in a server that is remotely located with respect to the processing system 900.

Figure 7:
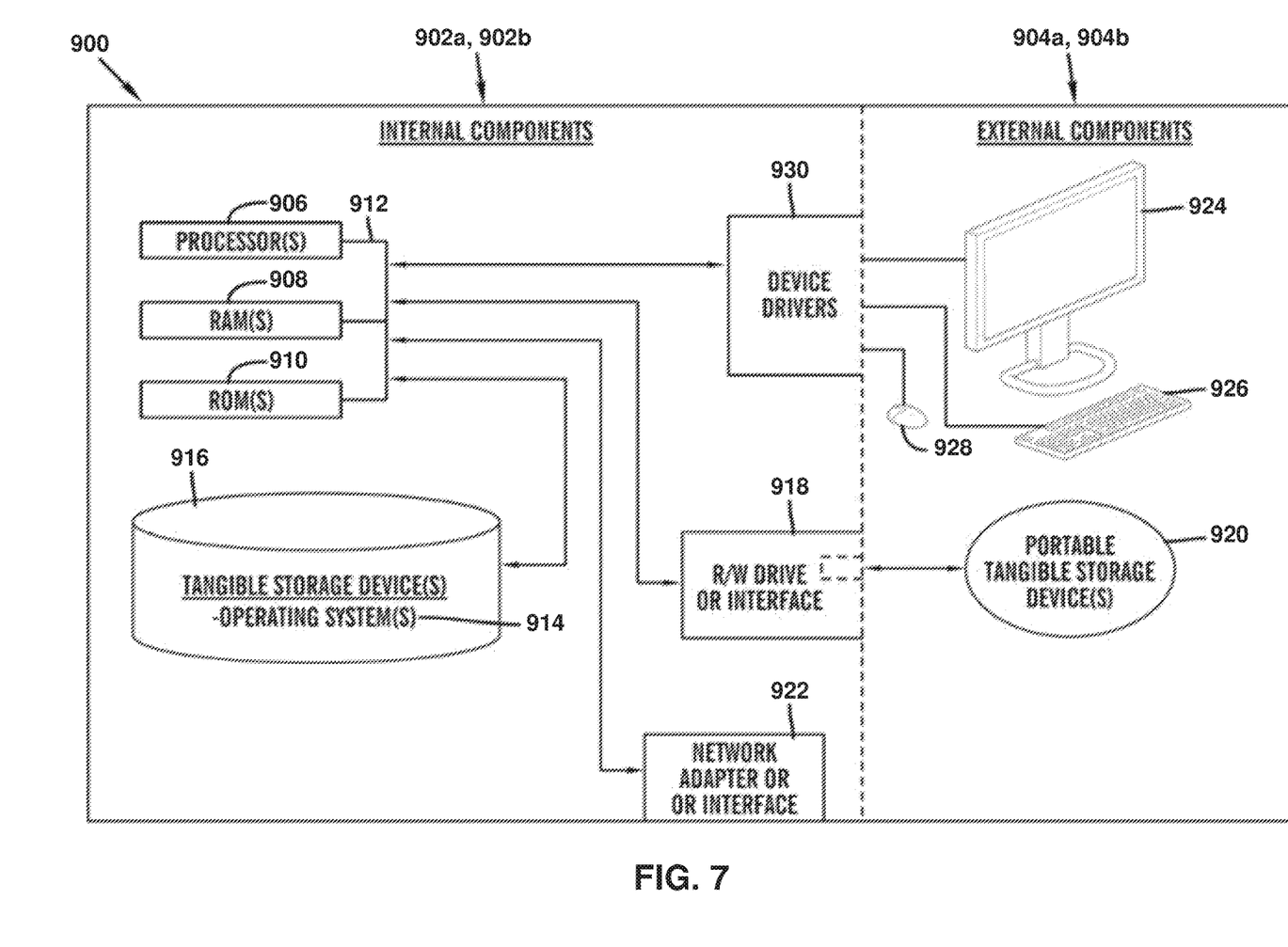
FIG. 7 is a block diagram of internal and external components of a computer system according to at least one embodiment.

FIG. 7 is a block diagram of internal and external components of a computer in which an integrated circuit with the redistribution layers according to present embodiments may be implemented. It should be appreciated that FIG. 7 provides only an illustration of one implementation and does not imply any limitations with regard to the environments in which different embodiments may be implemented. Many modifications to the depicted environments may be made based on design and implementation requirements.

Data processing system 902a, 902b, 904a, 904b is representative of any electronic device capable of executing machine-readable program instructions. Data processing system 902a, 902b, 904a, 904b may be representative of a smart phone, a computer system, PDA, or other electronic devices. Examples of computing systems, environments, and/or configurations that may represented by data processing system 902a, 902b, 904a, 904b include, but are not limited to, personal computer systems, server computer systems, thin clients, thick clients, hand-held or laptop devices, multiprocessor systems, microprocessor-based systems, network PCs, minicomputer systems, and distributed cloud computing environments that include any of the above systems or devices.

Each of the sets of internal components 902a, 902b includes one or more processors 906, one or more computer-readable RAMs 908 and one or more computer-readable ROMs 910 on one or more buses 912, and one or more operating systems 914 and one or more computer-readable tangible storage devices 916. The one or more processors 906 may include an integrated circuit with an X-ray shielding redistribution layer as described herein. The one or more operating systems 914 may be stored on one or more computer-readable tangible storage devices 916 for execution by one or more processors 906 via one or more RAMs 908 (which typically include cache memory). In the embodiment illustrated in FIG. 7, each of the computer-readable tangible storage devices 916 is a magnetic disk storage device of an internal hard drive. Alternatively, each of the computer-readable tangible storage devices 916 is a semiconductor storage device such as ROM 910, EPROM, flash memory, or any other computer-readable tangible storage device that can store a computer program and digital information.

Each set of internal components 902a, 902b also includes a R/W drive or interface 918 to read from and write to one or more portable computer-readable tangible storage devices 920 such as a CD-ROM, DVD, memory stick, magnetic tape, magnetic disk, optical disk or semiconductor storage device. A software program can be stored on one or more of the respective portable computer-readable tangible storage devices 920, read via the respective R/W drive or interface 918 and loaded into the computer-readable tangible storage device 916.

Each set of internal components 902a, 902b may also include network adapters (or switch port cards) or interfaces 922 such as a TCP/IP adapter cards, wireless wi-fi interface cards, or 3G or 4G wireless interface cards or other wired or wireless communication links. Software for being executed or ran by the one or more processors 906 may be downloaded from an external computer (e.g., server) via a network (for example, the Internet, a local area network or other, wide area network) and respective network adapters or interfaces 922. From the network adapters (or switch port adaptors) or interfaces 922, such software programs may be loaded into the computer-readable tangible storage device 916. The network may include copper wires, optical fibers, wireless transmission, routers, firewalls, switches, gateway computers and/or edge servers.

Each of the sets of external components 904a, 904b can include a computer display monitor 924, a keyboard 926, and a computer mouse 928. External components 904a, 904b can also include touch screens, virtual keyboards, touch pads, pointing devices, and other human interface devices. Each of the sets of internal components 902a, 902b also includes device drivers 930 to interface to computer display monitor 924, keyboard 926 and computer mouse 928. The device drivers 930, R/W drive or interface 918 and network adapter or interface 922 include hardware and software (stored in computer-readable tangible storage device 916 and/or ROM 910).

The flowchart in the Figures illustrate a manufacturing method according to various embodiments. In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises," "comprising," "includes," "including," "has," "have," "having," "with," and the like, when used in this specification, specify the presence of stated features, integers, steps, operations, elements, and/or components, but does not preclude the presence or addition of one or more other features, integers, steps, operations, elements, components, and/or groups thereof.

The descriptions of the various embodiments of the present invention have been presented for purposes of illustration but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A redistribution layer for an integrated circuit package, the redistribution layer comprising:
a first conductive layer having a resistivity of less than $3.6*10^{-8}$ Ω·m and having a thickness of greater than or equal to 1 μm; and
a second layer disposed directly on the first conductive layer, wherein the second layer comprises tungsten and has a thickness greater than or equal to 1 μm and less than or equal to 2 μm.

2. The redistribution layer according to claim 1, wherein the second layer consists of tungsten.

3. The redistribution layer according to claim 1, wherein the first conductive layer comprises aluminum.

4. An integrated circuit package comprising:
a first integrated circuit;
a frame connected to the first integrated circuit, the frame comprising a first input/output; and
a redistribution layer as recited in claim 1 and electrically connecting the first integrated circuit to the first input/output in the frame.

5. The integrated circuit package according to claim 4, wherein the redistribution layer is configured to provide shielding against X-rays that originate externally from the integrated circuit.

6. The integrated circuit package according to claim 4, further comprising a dielectric layer disposed directly on the redistribution layer, the dielectric layer being an outermost layer of the integrated circuit package.

7. The integrated circuit package according to claim 4, wherein the frame further comprises an integrated circuit embedding and a dielectric layer, the first integrated circuit being embedded in the integrated circuit embedding, the dielectric layer being disposed against the integrated circuit embedding, and the redistribution layer being disposed against the dielectric layer.

8. The integrated circuit package according to claim 4, further comprising a second redistribution layer, the second redistribution layer comprising:
a second conductive layer, and
a tungsten layer disposed directly on the second conductive layer, the tungsten layer comprising tungsten and having a thickness greater than or equal to 1 μm, wherein:
the redistribution layer is disposed at a first height level of the integrated circuit package;
the second redistribution layer is disposed at a second height level of the integrated circuit package; and
the first height level is different than the second height level.

9. The integrated circuit package according to claim 8, wherein the tungsten layer consists of tungsten.

10. The integrated circuit package according to claim 8, wherein the second conductive layer has a thickness greater than or equal to 1 μm.

11. The integrated circuit package according to claim 4, wherein the thickness of the second layer is less than or equal to 2 μm.

12. The integrated circuit package according to claim 4, wherein the first input/output is disposed higher than the first integrated circuit with respect to a vertical direction of the integrated circuit package;
wherein the second layer is disposed higher than the first conductive layer in the vertical direction; and
wherein side walls, with respect to a transverse direction from the vertical direction, of the first conductive layer are disposed to be substantially flush with side walls of the second layer.

13. A redistribution layer for an integrated circuit package, the redistribution layer comprising:
a first conductive layer having a resistivity of less than $3.6*10^{-8}$ Ω·m, having a thickness of greater than or equal to 1 μm, and comprising aluminum; and
a second layer disposed directly on the first conductive layer, the second layer comprising tungsten and having a thickness greater than or equal to 1 μm.

14. The redistribution layer according to claim 13, wherein the second layer consists of tungsten.

15. An integrated circuit package comprising:
a first integrated circuit;
a frame connected to the first integrated circuit, the frame comprising a first input/output; and
a redistribution layer as recited in claim 13 and electrically connecting the first integrated circuit to the first input/output in the frame.

16. The integrated circuit package according to claim 15, further comprising a second redistribution layer, the second redistribution layer comprising:
a second conductive layer, and
a tungsten layer disposed directly on the second conductive layer, the tungsten layer comprising tungsten and having a thickness greater than or equal to 1 μm, wherein:
the redistribution layer is disposed at a first height level of the integrated circuit package;
the second redistribution layer is disposed at a second height level of the integrated circuit package; and
the first height level is different than the second height level.

17. The integrated circuit package according to claim 15, wherein the first input/output is disposed higher than the first integrated circuit with respect to a vertical direction of the integrated circuit package;
wherein the second layer is disposed higher than the first conductive layer in the vertical direction; and
wherein side walls, with respect to a transverse direction from the vertical direction, of the first conductive layer are disposed to be substantially flush with side walls of the second layer.

18. A redistribution layer for an integrated circuit package, the redistribution layer comprising:
a first conductive layer having a resistivity of less than $3.6*10^{-8}$ Ω·m, having a thickness of greater than or equal to 1 μm, and comprising an extension forming a groove; and
a second layer disposed directly on the first conductive layer and filling the groove within the extension of the first conductive layer, the second layer comprising tungsten and having a thickness greater than or equal to 1 μm.

19. The redistribution layer according to claim 18, wherein the second layer consists of tungsten.

20. The redistribution layer according to claim 18, wherein the first conductive layer comprises aluminum.

\* \* \* \* \*